(12) United States Patent
Cabrera-Pizarro et al.

(10) Patent No.: US 10,217,549 B2
(45) Date of Patent: Feb. 26, 2019

(54) VOLTAGE-CONTROLLED RESISTOR BASED ON PHASE TRANSITION MATERIALS

(71) Applicant: BOARD OF TRUSTEES OF MICHIGAN STATE UNIVERSITY, East Lansing, MI (US)

(72) Inventors: Rafmag Cabrera-Pizarro, East Lansing, MI (US); Nelson Sepulveda-Alancastro, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 712 days.

(21) Appl. No.: 14/774,217

(22) PCT Filed: Mar. 7, 2014

(86) PCT No.: PCT/US2014/021588
§ 371 (c)(1),
(2) Date: Sep. 10, 2015

(87) PCT Pub. No.: WO2014/164268
PCT Pub. Date: Oct. 9, 2014

(65) Prior Publication Data
US 2016/0020005 A1    Jan. 21, 2016

Related U.S. Application Data

(60) Provisional application No. 61/778,579, filed on Mar. 13, 2013.

(51) Int. Cl.
*H01H 37/00* (2006.01)
*H01C 7/06* (2006.01)
(Continued)

(52) U.S. Cl.
CPC ............ *H01C 7/06* (2013.01); *G05D 23/1917* (2013.01); *H01H 61/013* (2013.01); *H01L 45/06* (2013.01);
(Continued)

(58) Field of Classification Search
None
See application file for complete search history.

(56) References Cited

U.S. PATENT DOCUMENTS 3,548,293 A * 12/1970 Hirsbrunner ........... H03K 19/02
                                              219/505
3,826,924 A    7/1974 Plough et al.
(Continued)

FOREIGN PATENT DOCUMENTS

GB          2286955 A     8/1995
JP       2007/013117 A    1/2007
WO    WO-2012/046638 A1   4/2012

*Primary Examiner* — Joseph M Pelham
(74) *Attorney, Agent, or Firm* — Harness, Dickey & Pierce, PLC (57) ABSTRACT

A voltage-controlled resistor is provided. The resistor structure includes first and second resistive elements each including a phase change material that changes resistance in response to a change in temperature of the phase change material. A heating element is arranged in thermal contact with the first and second resistive elements. A control circuit receives a selected input voltage and supplies power based on the selected input voltage to the heating element to heat the first and second resistive elements to a selected temperature. The first and second resistive elements, which are proximate to and electrically isolated from each other, have a selected resistance at the selected temperature. A feedback circuit senses a change in temperature of the first resistive element and adjusts power supplied to the heating element based on the change in temperature of the first resistive
(Continued)

element to maintain a resistance of the second resistive element at the selected resistance.

12 Claims, 9 Drawing Sheets (51) Int. Cl.
| | |
|---|---|
| *H01H 61/013* | (2006.01) |
| *H05B 1/02* | (2006.01) |
| *G05D 23/19* | (2006.01) |
| *H05B 3/00* | (2006.01) |
| *H01L 45/00* | (2006.01) |
| *H03K 17/78* | (2006.01) |

(52) U.S. Cl.
CPC .......... *H01L 45/065* (2013.01); *H01L 45/146* (2013.01); *H05B 1/023* (2013.01); *H05B 3/0014* (2013.01); *H01L 45/1286* (2013.01); *H03K 17/78* (2013.01)

(56) References Cited

U.S. PATENT DOCUMENTS

| | | | |
|---|---|---|---|
| 2008/0285333 A1* | 11/2008 | Lankhorst | G11C 11/56 365/163 |
| 2010/0078620 A1* | 4/2010 | Xi | G11C 11/5678 257/4 |
| 2013/0308378 A1 | 11/2013 | Manaka | |

* cited by examiner

FIG. 7C

VOLTAGE-CONTROLLED RESISTOR BASED ON PHASE TRANSITION MATERIALS

CROSS-REFERENCE TO RELATED APPLICATIONS

This application is a 371 National Phase of PCT/US2014/021588, filed on Mar. 7, 2014 and published in English as WO 2014/164268 A1 on Oct. 9, 2014, which claims the benefit of U.S. Patent Application Ser. No. 61/778,579, filed on Mar. 13, 2013, both of which are incorporated by reference herein.

GOVERNMENT RIGHTS

This invention was made with Government support under Contract No. ECCS1139773 awarded by the National Science Foundation. The U.S. Government has certain rights in this invention.

FIELD

The present disclosure relates to voltage-controlled resistors based on phase transition materials.

BACKGROUND

In the field of circuit design, designers often need resistors that can predictably change resistance based on an input control voltage applied to the resistors. Basically, a voltage-controlled resistor is a three-terminal device that varies the resistance between two terminals relative to a voltage applied to the third terminal. A wide variety of electronics use voltage-controlled resistors. Examples include variable-gain amplifiers, voltage-controlled oscillators, automatic gain controllers, low-distortion tunable filters, audio dynamic range compression, and electronically controlled phase advance and retard circuits.

Field-effect transistors (FETs) can be used as voltage-controlled resistors. The resistance change for an FET can be more than one order in magnitude. The resistance change, however, is not linear over the entire range. Instead, FETs can operate linearly only in a relatively low and small voltage region (typically around 1V) with a linearly tunable resistance change spanning less than one order in magnitude. Several techniques can be used to improve parameters such as linearity, voltage operation region, and linear tunable range of the resistance. These techniques, however, add complex circuitry or improve only a sub-set of these parameters.

Alternatively, a photo-resistor can be combined with a light-emitting diode, and the combination can be used as a voltage-controlled resistor. The combination, however, results in a very bulky device, which consumes large amounts of power. Additionally, the device suffers from a relatively low linearly tunable resistance span. Further, since these devices are made from discrete components, it becomes difficult to produce identical pairs of devices. Therefore feedback techniques are not feasible.

Digital potentiometers can also be used as voltage-controlled resistors. Digital potentiometers, however, suffer from several drawbacks. Some of them include: (1) digital quantization nature of potentiometers hinders possible resolution of tunable resistance values, which worsens as the resistance span increases; and (2) use of multiple digital components (e.g. microcontrollers or microprocessors) adds complexity while reducing practicality.

Accordingly, there is a need for a voltage-controlled resistor having a resistance that is linear over a large voltage range. Additionally, there is a need for a voltage-controlled resistor that can be operated linearly over a wide range of positive and negative voltages. Further, there is a need for a voltage-controlled resistor that does not require complex circuitry and that is compact and relatively inexpensive to fabricate.

This section provides background information related to the present disclosure which is not necessarily prior art.

SUMMARY

This section provides a general summary of the disclosure, and is not a comprehensive disclosure of its full scope or all of its features.

A voltage-controlled resistor is provided. The resistor structure includes a first resistive element including a phase change material that changes resistance in response to a change in temperature, and a second resistive element including the phase change material in thermal contact with and electrically isolated from the first resistive element. The resistor structure further comprises a heating element arranged proximate to and in thermal contact with the first and second resistive elements, and a control circuit that receives a selected input voltage and that supplies power based on the selected input voltage to the heating element to heat the first and second resistive elements to a selected temperature. The first and second resistive elements have a selected resistance at the selected temperature. The resistor structure may further comprises a feedback circuit that senses a change in temperature of the first resistive element and that adjusts power supplied to the heating element based on the change in temperature of the first resistive element to maintain a resistance of the second resistive element at the selected resistance.

In other features, the second resistive element operates as a voltage-controlled resistor, and the resistance of the second resistive element is controlled by the selected input voltage.

In other features, the phase change material is vanadium dioxide having a first state at temperatures less than approximately 68 degrees Celsius and a second state at temperatures greater than or equal to approximately 68 degrees Celsius.

In other features, the resistance of the second resistive element is proportional to the selected input voltage.

In other features, the resistance of the second resistive element is independent of (i) voltage applied across the second resistive element and (ii) current flowing through the second resistive element within an operating range.

In still other features, a method is presented. The method comprises receiving an input voltage selected by a user or a circuit and supplying power based on the selected input voltage to a heating element to heat first and second resistive elements to a selected temperature. The heating element is arranged proximate to and in thermal contact with the first and second resistive elements. The first and second resistive elements are electrically isolated from each other and include a phase change material having a selected resistance at the selected temperature. The method further comprises sensing a feedback signal from the first resistive element. The feedback signal indicates a resistance of the first resistive element. The method further comprises adjusting the power supplied to the heating element based on the feedback signal from the first resistive element to maintain resistances of both the first and second resistive elements at the same value.

In still other features, the voltage-controlled resistor is implemented as an integrated circuit. The integrated circuit is comprised of a substrate and a layer of an insulating material arranged on the substrate. A first resistive element comprising a phase change material is arranged along a first plane in the layer of the insulating material. A second resistive element comprising the phase change material is arranged along the first plane in the layer of the insulating material. A heating element is arranged along a second plane in the layer of the insulating material. The second plane is parallel to the first plane. The heating element is in thermal contact with the first and second resistive elements. A circuit receives a selected input voltage and supplies power based on the selected input voltage to the heating element to heat the first and second resistive elements to a selected temperature. The first and second resistive elements have the same selected resistance at the selected temperature. The circuit adjusts the power supplied to the heating element in response to sensing a feedback signal from the first resistive element to maintain a resistance of the second resistive element at the selected resistance.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

The present disclosure relates to a voltage-controlled resistor that allows for (1) much broader tunable resistance values (several orders of magnitude) than other techniques, (2) use of positive or negative voltages that are not limited to the low values required by other techniques, (3) a linear response, (4) a much simpler device than photo-resistor/LED pairs and digital potentiometers, and (5) the control voltage to be completely isolated from the controlled resistance Specifically, the present disclosure relates to a voltage-controlled resistor using a phase change material called vanadium dioxide ($VO_2$) that demonstrates a variable resistance with change in temperature. $VO_2$ exhibits a phase change at approximately 68° C. causing a several orders of magnitude difference in electrical resistance. By controlling this phase change with a heating element and feedback circuitry, linearity in the changing resistance can be achieved. More specifically, a thin film of $VO_2$ can be used as resistor material. The thin film of $VO_2$ is subjected to heat to control the amount of phase change taking place and thus to control the resistance of the material.

The proposed circuit design described below in detail is one of many possible design solutions that can use a $VO_2$ resistor. The proposed circuit can include a heater made from a metal (e.g., platinum or tungsten) or a highly doped semiconductor having a high-melting temperature, a feedback $VO_2$ resistor, and a target $VO_2$ resistor along with a controller to adjust the power input into the heater. Power to the heater is increased or decreased to achieve a certain resistor temperature (and thus a certain resistance), and the feedback resistor ensures that the power is adjusted as necessary to maintain the desired resistance.

Figure 1A:
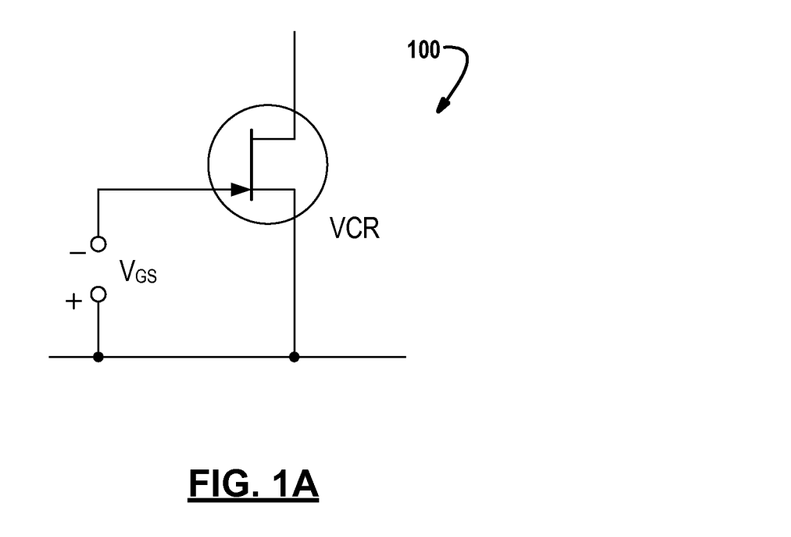
FIG. 1A is a schematic of a field-effect transistor (FET) used as a voltage-controlled resistor.
Figure 1B:
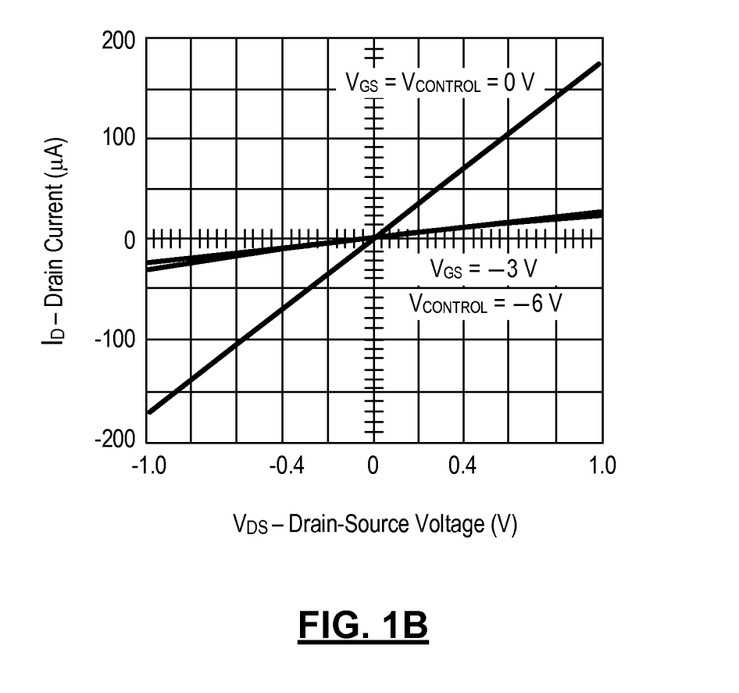
FIGS. 1B-1D show various electrical characteristics of the FET of FIG. 1A.
Figure 1C:
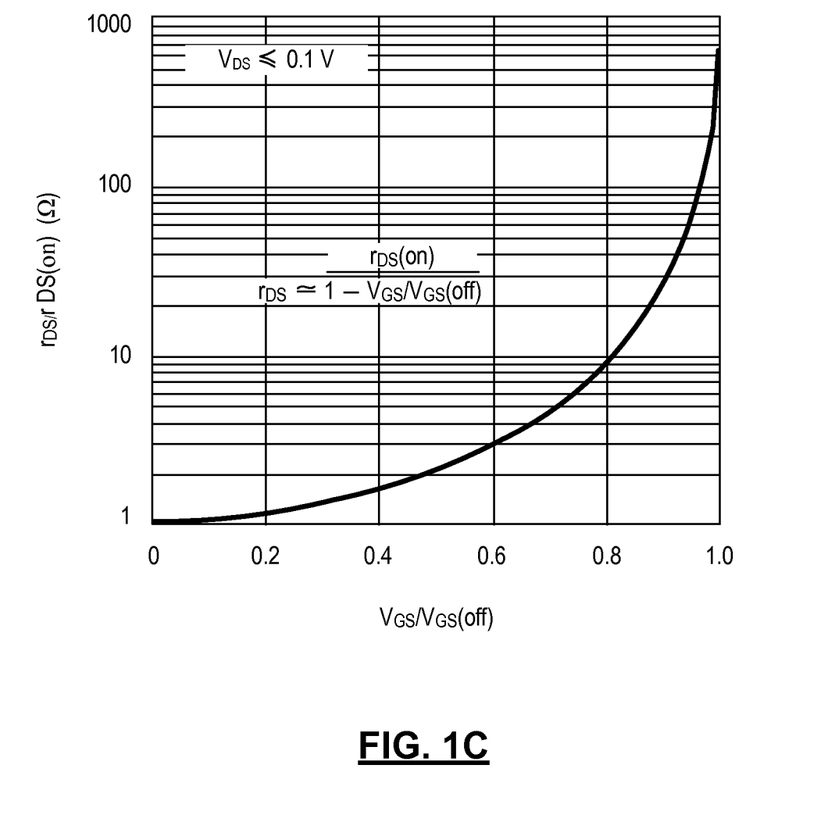
Figure 1D:
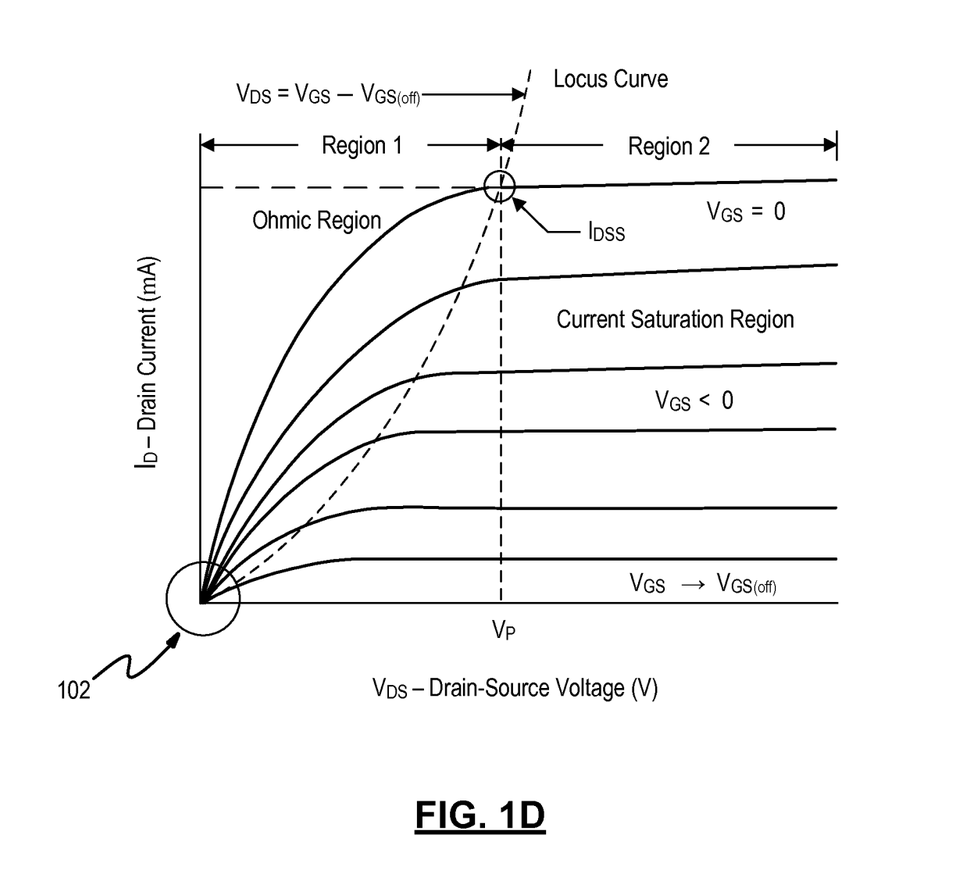

Referring now to FIGS. 1A-1D, an FET 100 can be used as a voltage-controlled resistor. In FIG. 1A, the resistance of the FET 100 can be varied by varying $V_{GS}$. FIGS. 1B-1D show different electrical characteristics of the FET 100. A circled area 102 in FIG. 1D shows that the output resistance of the FET 100 is constant with respect to the applied voltage over a very small range (+/−1V). When used as a voltage-controlled resistor, the FET 100 suffers from several drawbacks. For example, the FET 100 has a small current capability, very small voltage range, and very small linear resistance range. The maximum usable impedance of the FET 100 is a few kilo ohms. The resistor is not isolated from the control voltage. Additionally, the FET 100 suffers from signal clipping at oscillation peaks and noise interference during amplification.

Figure 2A:
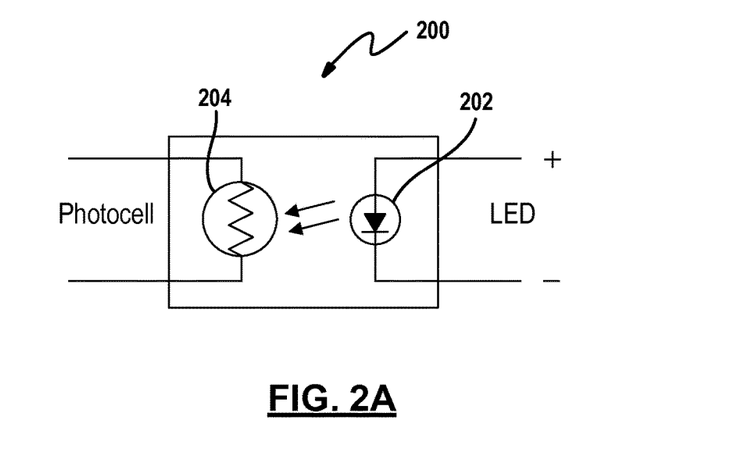
FIG. 2A is a schematic of a voltage-controlled resistor comprising a light-emitting diode (LED) and a photocell.
Figure 2B:
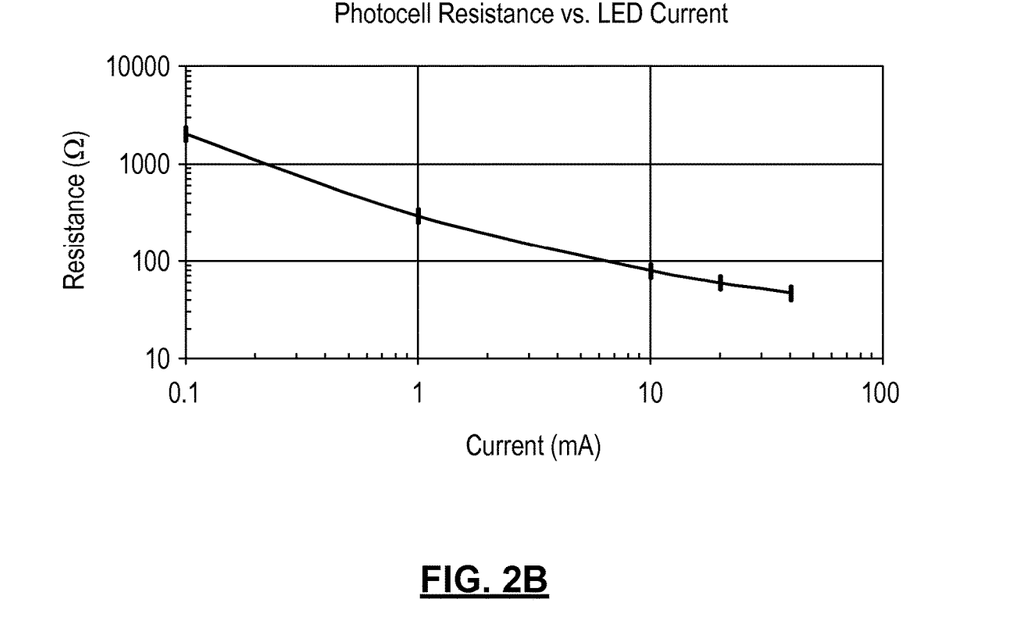
FIG. 2B shows an electrical characteristic of the voltage-controlled resistor of FIG. 2A.

Referring now to FIGS. 2A and 2B, a voltage-controlled resistor 200 based on an LED and a photo-resistor is shown. In FIG. 2A, the voltage-controlled resistor 200 includes an LED 202 and a photocell 204. A voltage applied across the LED 202 changes the amount of light emitted by the LED 202. The amount of light incident on the photocell 204 changes the resistance of the photocell 204. Accordingly, the resistance across the photocell 204 changes based on the voltage applied across the LED 202. FIG. 2B shows an electrical characteristic of the voltage-controlled resistor 200.

The voltage-controlled resistor 200 suffers from the following drawbacks. The voltage-controlled resistor 200 is relatively large in size (few mms). The voltage-controlled resistor 200 has relatively high power consumption (100 s of mW). The voltage-controlled resistor 200 has a non-linear performance with one device. Linear performance requires two identically calibrated devices with one connected in feedback, which are difficult and expensive to fabricate. The voltage-controlled resistor 200 has a relatively slow resistance adjustment time period.

Digital potentiometers (not shown) suffer from the following disadvantages. Digital potentiometers require complicated circuits including a microcontroller/processor. Digital control of resistance only allows discrete resistances, not analog control. Resistance can only be changed in fixed increments. Resolution depends on resistance range. Switching noise pollutes analog signal.

Figure 3A:
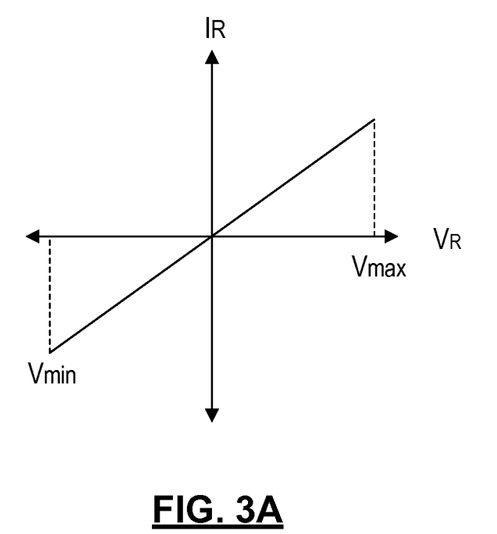
FIGS. 3A and 3B show electrical characteristics of an ideal voltage-controlled resistor.
Figure 3B:
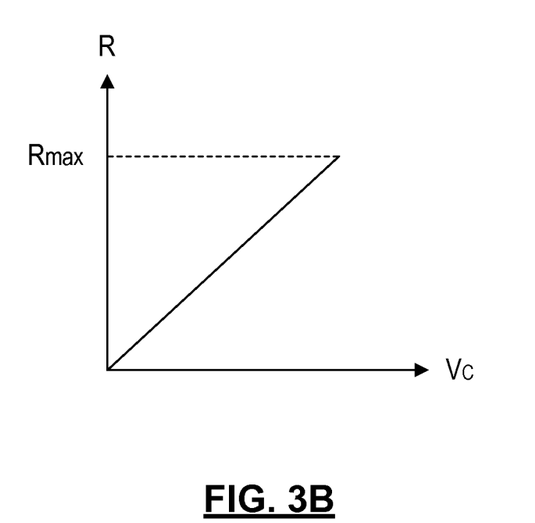

Referring now to FIGS. 3A and 3B, electrical characteristics of an ideal voltage-controlled resistor are shown. In FIG. 3A, the resistance of the ideal voltage-controlled resistor should be independent of voltage applied across the ideal voltage-controlled resistor. The ideal voltage-controlled resistor should work for arbitrarily large positive and negative voltages subject to limitations based on power dissipation and dielectric breakdown. In FIG. 3B, the resistance of the ideal voltage-controlled resistor should change linearly with control voltage. Further, maximum resistance of the ideal voltage-controlled resistor can be arbitrarily large or small.

Figure 4:
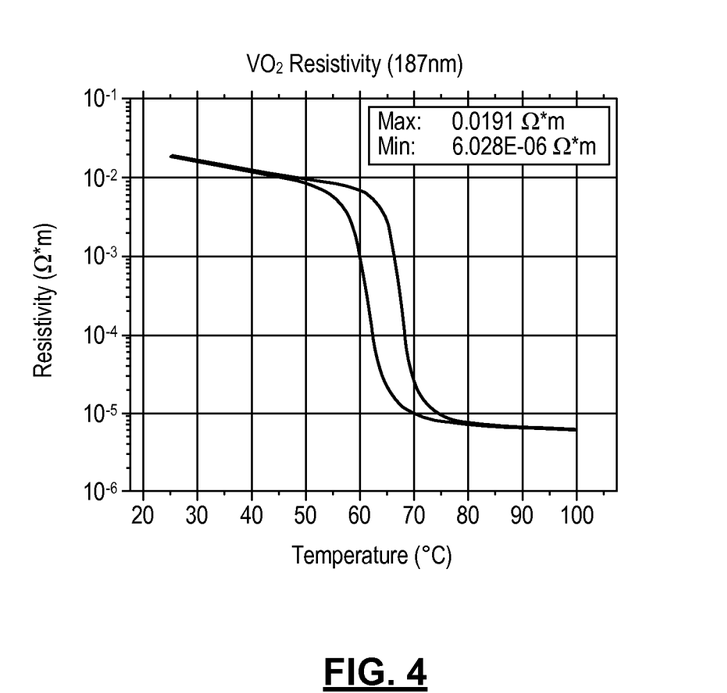
FIG. 4 shows electrical characteristics of vanadium dioxide ($VO_2$).

Referring now to FIG. 4, electrical characteristics of vanadium oxide ($VO_2$) are shown. $VO_2$ material has a solid-solid phase transition at approximately 68 degrees Celsius, where the resistivity of the $VO_2$ material can drop several orders in magnitude. The resistivity of the $VO_2$ material does not depend on the current or voltage applied to the $VO_2$ material. The resistivity of the $VO_2$ material depends only on the temperature of the $VO_2$ material. The $VO_2$ material can be deposited in the form of thin films using MEMS fabrication techniques and can be patterned at a micro-scale to create resistors of any desired value. $VO_2$-based resistors can operate at much higher voltages and currents than the FET and LED/photo-resistor based resistors.

Figure 5:
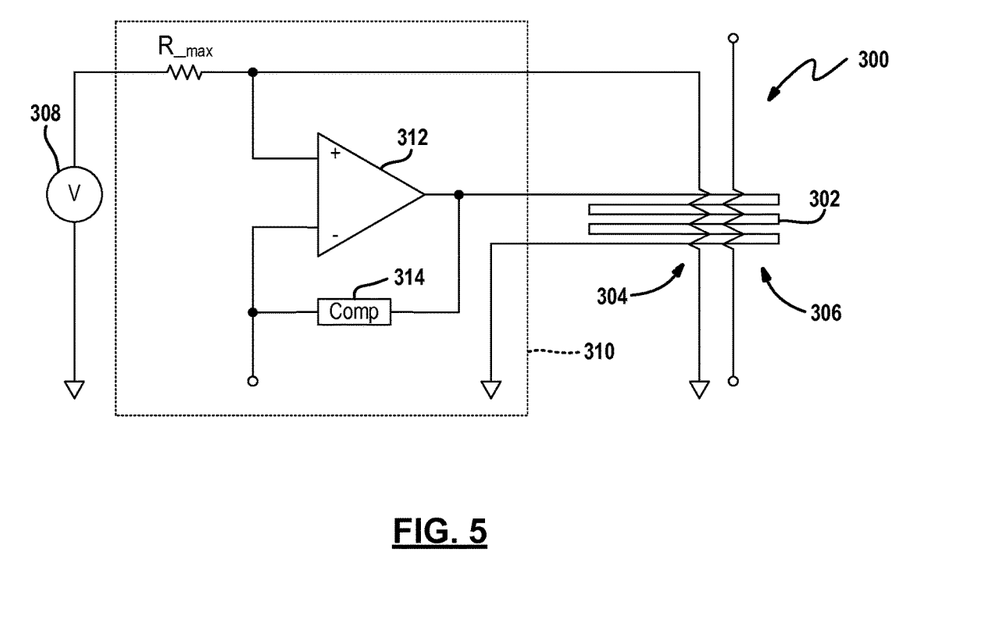
FIG. 5 is a schematic of a voltage-controlled resistor employing $VO_2$ resistors according to the present disclosure.

Referring now to FIG. 5, a voltage-controlled resistor (VCR) system 300 according to the present disclosure is shown. The VCR system 300 includes a heating element 302, a first $VO_2$ resistor $VO_2$—R1 304 (also called a feedback resistor), a second $VO_2$ resistor $VO_2$—R2 306 (also called a target resistor), a voltage source 308, and a control circuit 310. For example only, the heating element 302 may include a platinum heating element. Any metal or highly doped semiconductor with a melting temperature above the deposition temperature of the $VO_2$ can be used as a heater. The second $VO_2$ resistor $VO_2$—R2 306 is controlled by and varies according to a voltage $V_{control}$ applied at an inverting terminal of an amplifier 312 as explained below. Accordingly, the second $VO_2$ resistor $VO_2$—R2 306 can be connected to any circuit requiring a voltage-controlled resistor. In other implementations, the VCR system 300 can include additional or fewer components than those shown.

A value of the first $VO_2$ resistor $VO_2$—R1 304 is selected by selecting a value of the voltage $V_{control}$ applied at the inverting terminal of an amplifier 312. The control circuit 310 supplies power to the heating element 302. The heating element 302 heats the first and second $VO_2$ resistors $VO_2$—R1 304 and $VO_2$—R2 306 to a certain temperature. The temperature determines the resistance of the first and second $VO_2$ resistors $VO_2$—R1 304 and $VO_2$—R2 306.

The first and second $VO_2$ resistors $VO_2$—R1 304 and $VO_2$—R2 306 are in thermal contact with the heating element 302. Accordingly, the heating element 302 evenly heats both the first and second $VO_2$ resistors $VO_2$—R1 304 and $VO_2$—R2 306, and the first and second $VO_2$ resistors $VO_2$—R1 304 and $VO_2$—R2 306 are at the same temperature and therefore have the same resistance.

In some implementations, the first and second $VO_2$ resistors $VO_2$—R1 304 and $VO_2$—R2 306 may be in direct thermal contact with the heating element 302 while in other implementations the first and second $VO_2$ resistors $VO_2$—R1 304 and $VO_2$—R2 306 may be in indirect thermal contact with the heating element 302. For example, in case of indirect thermal contact, the first and second $VO_2$ resistors $VO_2$—R1 304 and $VO_2$—R2 306 may be separated from the heating element 302 by a thermally conducting but electrically insulating material (e.g., silicon dioxide or $SiO_2$).

The control circuit 310 includes the amplifier (e.g., an operational amplifier) 312 and a compensation circuit 314 that provide feedback from the first $VO_2$ resistor $VO_2$—R1 304 to control the power supplied to the heating element 302. Specifically, the control circuit 310 monitors the first $VO_2$ resistor $VO_2$—R1 304 and controls power supplied to the heating element 302 to maintain the first $VO_2$ resistor $VO_2$—R1 304 (and therefore the second $VO_2$ resistor $VO_2$—R2 306) at the selected value. If the first $VO_2$ resistor $VO_2$—R1 304 changes due to temperature variation, the control circuit 310 uses feedback from the first $VO_2$ resistor $VO_2$—R1 304 to control the temperature of the heating element 302 to compensate for temperature variation in the first $VO_2$ resistor $VO_2$—R1 304 and for self-heating (Joule heating).

The feedback signal from the first $VO_2$ resistor $VO_2$—R1 304 indicates the resistance of the first $VO_2$ resistor $VO_2$—R1 304, which should be the same as the second $VO_2$ resistor $VO_2$—R2 306 since the first $VO_2$ resistor $VO_2$—R1 304 and the second $VO_2$ resistor $VO_2$—R2 306 are in thermal contact and proximate to each other. Based on the feedback signal, the control circuit 310 controls the power supplied to the heating element 302 and controls the resistance of the first $VO_2$ resistor $VO_2$—R1 304. By controlling the resistance of the first $VO_2$ resistor $VO_2$—R1 304, the control circuit 310 effectively controls the resistance of the second $VO_2$ resistor $VO_2$—R2 306 since it is assumed that the second $VO_2$ resistor $VO_2$—R2 306, being in thermal contact with the first $VO_2$ resistor $VO_2$—R1 304, has the same resistance as the first $VO_2$ resistor $VO_2$—R1 304.

The control circuit 310 is calibrated to maintain the VO2 material of the first and second VO2 resistors VO2-R1 304 and VO2-R2 306 in the linear range of a hysteretic resistance shown in FIG. 4. The VCR system 300 can have a large resistance range (nearly $10^3$ to $10^5$ ohms) with high voltage range and current tolerance. The VCR system 300 also has low power drain (between 1-10 mw), and the resistance of the VCR system 300 is not impacted by voltage or current applied to the VCR system 300 (i.e., to the second VO2 resistor VO2-R2 306).

The VCR system 300 according to the present disclosure provides many advantages. For example, maximum and minimum voltages that can be used to control the resistor are limited only by power dissipation considerations. Self-correcting feedback allows for a large temperature window over which the resistor can be operated. The VCR system 300 has a linear current versus voltage curve for a relatively large voltage range. The VCR system 300 has a large resistance range, low power consumption, and simple design. Further, good matching between resistors can be obtained when the VCR system 300 is mass-produced.

While VO2 is used as an example material for fabricating VCR system 300 according to the present disclosure, other types of materials are within the scope of the invention. For example, different insulator-to-metal transition (IMT) materials exhibit phase transition temperatures different than that of $VO_2$. These materials therefore can be used as resistive materials instead of VO2 in the VCR system 300 in applications operating close to their respective transition temperatures. Some of these materials include $V_2O_3$ (transition temperature near −123 degrees C.), $Ti_2O_3$ (transition temperature near 201 degrees C.), and $V_2O_5$ (transition temperature near 257 degrees C.).

Additionally, the VCR system 300 according to the present disclosure may be fabricated using IMT materials in which phase change can be induced by parameters other than temperature. For example, if the IMT of a material can be induced by an external electric field, the VCR system 300 according to the present disclosure can be adapted by modifying the design to provide an external electric field (instead of the resistive heater) to the pair of $VO_2$ resistors in the voltage-controlled resistor 300.

Figure 6:
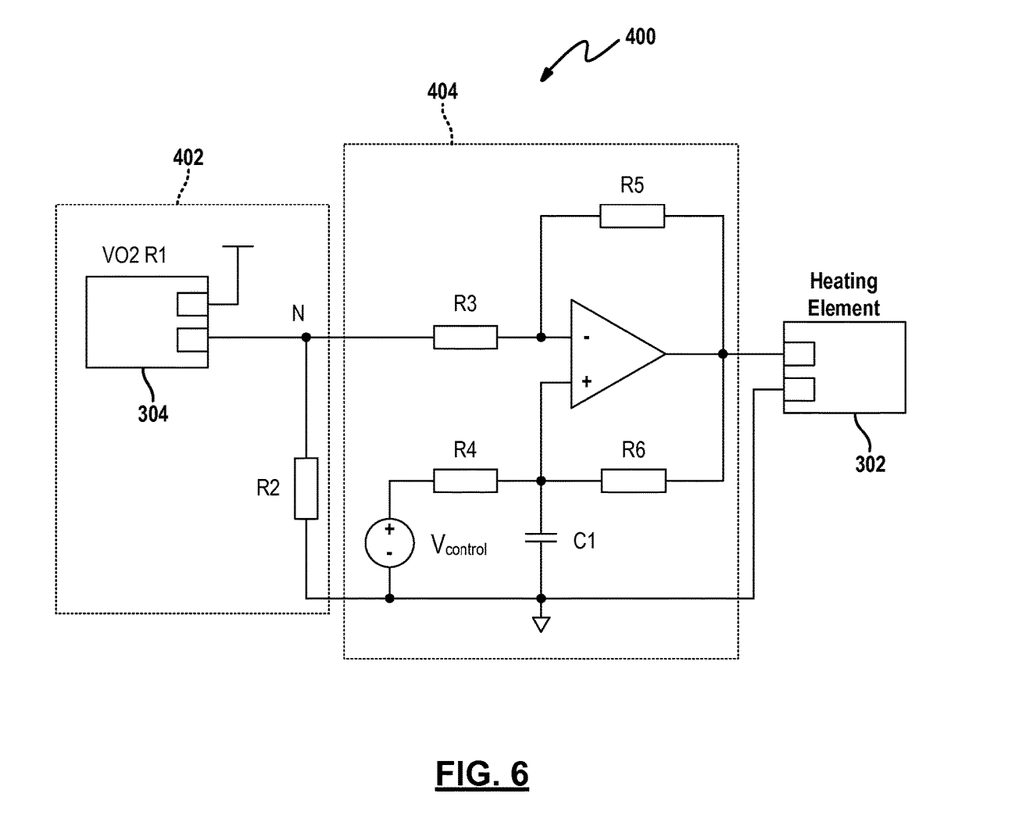
FIG. 6 is an example of a feedback circuit that can be used with a voltage-controlled resistor employing $VO_2$ resistors according to the present disclosure.

Referring now to FIG. 6, an example of a feedback circuit 400 that can be used with the VCR system 300 according to the present disclosure is shown. The feedback circuit 400 comprises a voltage divider 402 and a proportional integral controller 404. The voltage divider 402 includes the first VO2 resistor VO2 R1 304 and a resistor R2. The proportional integral controller 404 compares the voltage across the voltage divider 402 at node N to the control voltage $V_{control}$ and controls the power to the heating element 302 based on the difference between the voltage at the node N and $V_{control}$.

Figure 7A:
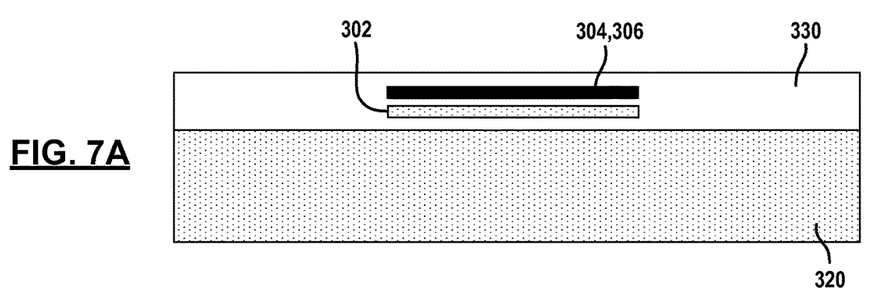
FIG. 7A is a cross-section of a MEMS device comprising the voltage-controlled resistor employing $VO_2$ resistors according to the present disclosure.
Figure 7B:
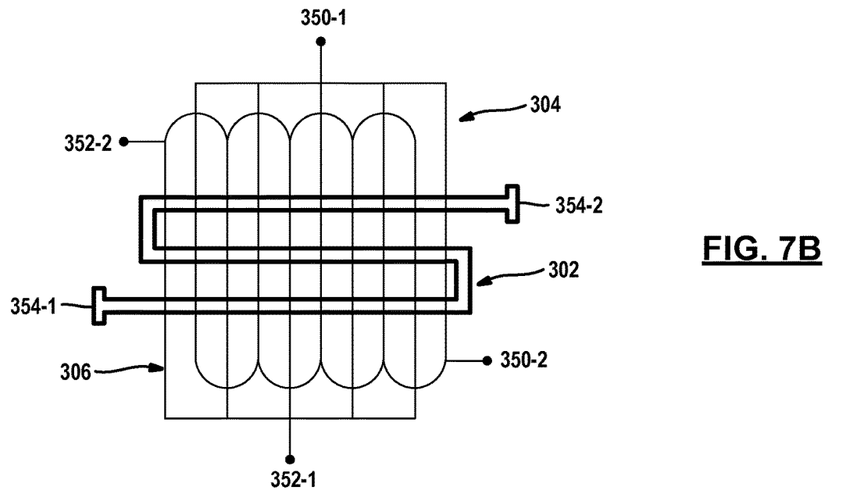
FIG. 7B is a top view of an example embodiment of the $VO_2$ resistors in the integrated circuit of FIG. 7A.
Figure 7C:
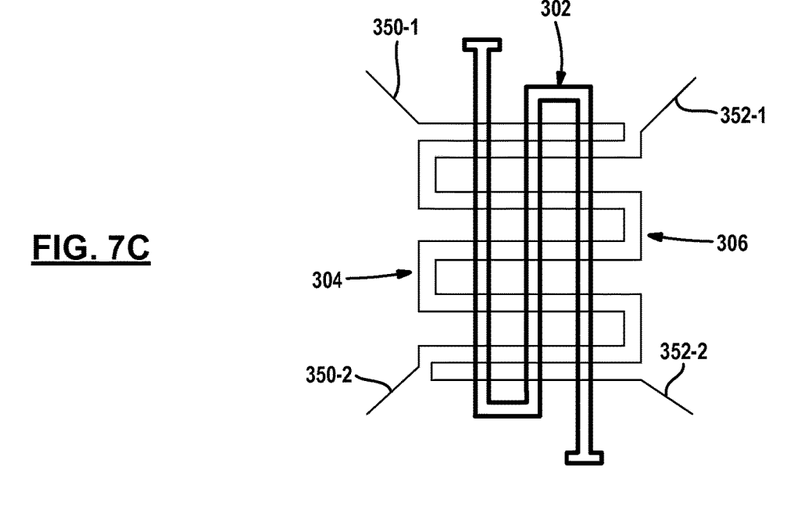
FIG. 7C is a top view of an alternative embodiment of the $VO_2$ resistors in the integrated circuit of FIG. 7A.

Referring now to FIGS. 7A-7C, an example implementation of the VCR system 300 according to the present disclosure is shown. FIG. 7A shows a cross-section of an integrated circuit comprising the voltage-controlled resistor 300. FIG. 7A shows only an example implementation and other implementations using different arrangements are contemplated. The VCR system 300 includes a silicon substrate 320 and a layer of an insulating material (e.g., SiO2) 330 arranged on the substrate 320. The first and second VO2 resistors VO2 R1 304 and VO2 R2 306 are arranged along a first plane in the layer of the insulating material 330. The heating element 302 is arranged along a second plane in the layer of the insulating material 330. The second plane is parallel to the first plane. The heating element 302 is in thermal contact with the first and second VO2 resistors VO2 R1 304 and VO2 R2 306.

FIG. 7B shows a top view of the shape of the first and second VO2 resistors VO2 R1 304 and VO2 R2 306 and respective electrodes. The first VO2 resistor VO2 R1 304 has electrodes 350-1 and 350-2, and the second VO2 resistor VO2 R2 306 has electrodes 352-1 and 352-2. FIG. 7C is a top view showing an alternative embodiment for the shapes of the first and second VO2 resistors VO2 R1 304 and VO2 R2 306. In each embodiment, the heating element 302 is shown below the VO2 resistors. It is readily understood that these figures show an example implementation and other implementations using different arrangements are contemplated by this disclosure.

Figure 8:
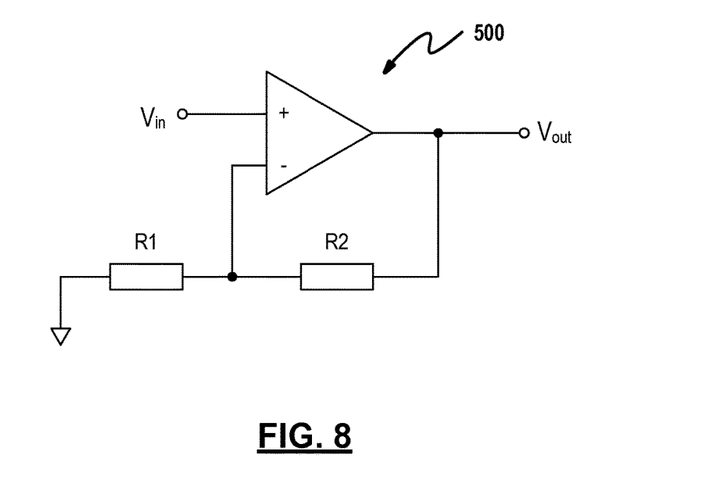
FIG. 8 is an example of a variable gain amplifier circuit using the voltage-controlled resistor employing $VO_2$ resistors according to the present disclosure.

Referring now to FIG. 8, an example of an application where the VCR system 300 according to the present disclosure can be used is shown. In the example shown, an audio amplifier uses the VCR system 300 according to the present disclosure as resistor R2 creating a variable gain amplifier. While a non-inverting amplifier is shown for example only, inverting amplifiers can also use the VCR system 300 according to the present disclosure.

Applications in audio amplification require ability to withstand high variability and no noise infiltration or distortion. Non-inverting and inverting amplifiers rely upon resistors in the circuit design to achieve a desired amplification. Use of the VCR system 300 according to the present disclosure as $R_2$ in this amplifier design allows a user desired variable amplification. The output voltage of the amplifier 500 is given by the following equation.

$$V_{out} \approx \frac{V_{in}}{\beta} = \frac{V_{in}}{\frac{R_1}{R_1 + R_2}} = V_{in}\left(1 + \frac{R_2}{R_1}\right)$$

The use of the VCR system 300 according to the present disclosure in the audio amplifier is shown as an example only. The VCR system 300 according to the present disclosure can be used in many other applications. For example, the applications may include, but are not limited to variable-gain amplifiers, voltage-controlled oscillators, automatic gain controllers, low-distortion tunable filters, audio dynamic range compression, and electronically controlled phase advance and retard circuits.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A system comprising:
   a first resistive element including a phase change material that changes resistance in response to a change in temperature of the phase change material;
   a second resistive element including the phase change material arranged in thermal contact with and electrically isolated from the first resistive element; and
   a heating element arranged proximate to and in thermal contact with the first and second resistive elements;
   a control circuit electrically coupled to the heating element, the control circuit is configured to receive an input voltage and operates to supply power to the heating element, wherein power supplied to the heating element changes the resistance of the second resistive element linearly and continuously within a range of resistance values as a function of magnitude of the input voltage; and
   a feedback circuit that senses resistance of the first resistive element and adjusts power supplied by the control circuit to the heating element to maintain a linear relationship between the input voltage and resistance of the second resistive element.

2. The system of claim 1 wherein the phase change material is vanadium dioxide having a first state at temperatures less than approximately 68 degrees Celsius and a second state at temperatures greater than or equal to approximately 68 degrees Celsius.

3. The system of claim 1 wherein the resistance of the second resistive element is independent of (i) voltage applied across the second resistive element and (ii) current flowing through the second resistive element within an operating range.

4. A method for operating a voltage-controlled resistor, comprising:
   providing a heating element proximate to and in thermal contact with a first resistive element and a second resistive element, wherein the first and second resistive elements are comprised of a phase change material and electrically isolated from each other;
   receiving, by a control circuit, an input voltage selected by a user or a circuit;
   supplying, by the control circuit, power to a heating element, wherein power supplied to the heating element changes the resistance of the second resistive element linearly and continuously within a range of resistance values as a function of magnitude of the input;
   sensing a feedback signal from the first resistive element, wherein the feedback signal indicates a resistance of the first resistive element; and
   adjusting the power supplied to the heating element based on the feedback signal from the first resistive element to maintain a linear relationship between the input voltage and the resistance of the second resistive element.

5. The method of claim 4 wherein the phase change material is vanadium dioxide having a first state at temperatures less than approximately 68 degrees Celsius and a second state at temperatures greater than or equal to approximately 68 degrees Celsius.

6. The method of claim 4 wherein the resistance of the second resistive element is independent of (i) voltage applied across the second resistive element and (ii) current flowing through the second resistive element.

7. The method of claim 4 wherein the second resistive element is electrically isolated from the first resistive element.

8. An integrated circuit comprising:
   a substrate;
   a layer of an insulating material arranged on the substrate;
   a first resistive element comprising a phase change material arranged along a first plane in the layer of the insulating material;
   a second resistive element comprising the phase change material arranged along the first plane in the layer of the insulating material; and
   a heating element arranged along a second plane in the layer of the insulating material, wherein the second plane is parallel to the first plane, and wherein the heating element is in thermal contact with the first and second resistive elements; and
   a circuit that
   receives a selected input voltage,
   supplies power to the heating element that changes the resistance of the second resistive element linearly and continuously within a range of resistance values as a function of magnitude of the selected input voltage, and
   adjusts the power supplied to the heating element in response to sensing a feedback signal from the first resistive element to maintain a linear relationship between the input voltage and the resistance of the second resistive element.

9. The integrated circuit of claim 8 wherein the phase change material is vanadium dioxide having a first state at temperatures less than approximately 68 degrees Celsius and a second state at temperatures greater than or equal to approximately 68 degrees Celsius.

10. The integrated circuit of claim 8 wherein the resistance of the second resistive element is independent of (i) voltage applied across the second resistive element and (ii) current flowing through the second resistive element within an operating range.

11. The integrated circuit of claim 8 wherein the second resistive element is electrically isolated from the first resistive element, the heating element, and the circuit.

12. The integrated circuit of claim 8 wherein the substrate is a silicon substrate, the insulating material is silicon dioxide, and the heating element is a platinum heating element.

* * * * *